April 14, 1964 T. M. CORRY 3,129,116

THERMOELECTRIC DEVICE

Filed March 2, 1960 3 Sheets-Sheet 2

WITNESSES:
Bernard R. Gieguey
James F. Young

INVENTOR
Thomas M. Corry
BY E. H. Liss
ATTORNEY

April 14, 1964 T. M. CORRY 3,129,116

THERMOELECTRIC DEVICE

Filed March 2, 1960 3 Sheets-Sheet 3

United States Patent Office 3,129,116
Patented Apr. 14, 1964

3,129,116
THERMOELECTRIC DEVICE

Thomas M. Corry, Monroeville, Pa., assignor to Westinghouse Electric Corporation, East Pittsburgh, Pa., a corporation of Pennsylvania
Filed Mar. 2, 1960, Ser. No. 12,426
4 Claims. (Cl. 136—4)

The present invention relates to thermoelectric devices, and more particularly, to means for preventing failure of the thermoelectric assemblies due to shrinkage and expansion of the heat exchanger during heating cycles.

When a circuit is formed of two metals of different material and one of their junctions is at a higher temperature than another, an electromotive force is produced in the circuit. This thermoelectric effect is known as the Seebeck effect. Besides the Seebeck effect there are two other thermoelectric effects: the Peltier effect and the Thomson effect.

The Peltier effect is the inverse of the Seebeck effect. When two dissimilar metals are connected in series with a source of electromotive force which establishes a current in the circuit, one junction will become heated and the other cooled. This effect is distinct from the heating of both metals by the current due to their resistance.

An analysis of the foregoing effects resulted in the Thomson effect. This effect deals with a uniform metal bar. When different parts of the same metal are at different temperatures, electromotive force exists between the different parts.

Thermocouples utilizing these effects have been used for a long time, but recently with the advance of the modern science of semiconductors, practical application of thermoelectricity in power applications has become of importance. The early thermocouple proved to be quite inefficient. The prospects of attaining appreciable efficiencies in thermoelectric generators, refrigerators and heating devices with the advent of semiconductors has improved considerably.

Thermoelectric devices for use in power applications, such generators, refrigerators or heating devices, consist essentially of a plurality of thermoelectric elements in which precisely machined elements are assembled into a rigid ladder of series connected elements. The ladder is pressed between a heat source and a heat sink.

Presently available thermoelectric materials used in the assembly of thermoelectric generators have low yield strength in shear and tensile stress. To operate efficiently, these materials must maintain good thermal contact between the hot and cold sides of the heat exchanger structure. Due to the high operating temperature (600° C.–20° C. or higher) and the large temperature difference between the heat source and heat sink, it is difficult to build a rigid heat exchanger structure that will maintain good thermal contact with the thermal elements without creating excessive shear and tensile stresses in the material and causing failure of the generator. When a rigid ladder assembly of the known type, it can be seen that uneven contraction or expansion of the assembly, and surface imperfections on the walls of the heat source and heat sink, will cause poor thermal contact to exist along portions of the thermocouple ladder. Thermoelectric devices for high power application consist of many elements connected in series or series-parallel. Therefore, a flexible linkage is required between the elements of the assembly and the hot and cold sources to connect, for example, one hundred elements in series to produce an assembly which will produce the desired voltage, in order to avoid damage by thermal stresses.

The present invention discloses a flexible linkage which consists of a highly flexible copper cable attached between the cold side of a thermal element and a cooling fin. A plurality of thermoelectric elements, as for example alternately P and N type semiconductor bodies, are connected in series or series parallel by flexible connecting straps. A coil spring is slipped around the flexible copper cable and is disposed between the thermal element and the copper strap adjacent the cooling fin. This structure permits each connecting strap of the ladder to maintain excellent thermal contact with the heat exchanger wall despite structural shrinking and expansion or loose tolerances in the machining and essentially of the thermal elements. If a copper cable is used, generator efficiency is reduced only slightly due to the fact that copper has about 200 times the thermal conductivity and approximately 1000 times the electrical conductivity of the thermoelectric material. In this assembly the thermoelements are always held in compression, thereby improving the shock resistance of the assembly and improving the reliability. This novel construction permits greater flexibility in generator design. The need for close tolerances in the machining of the thermoelements is eliminated. The heat exchanger can be designed to permit structural and component expansion without affecting generator efficiency or reliability. In addition, thermoelement efficiency can be more easily optimized because the lengths of the two thermoelectric pellets in a generator subassembly no longer have to be nearly equal. This generator design innovation ensures good thermal contact between the hot and cold fins for each element thereby minimizing thermoelectric breakage and reducing generator cost.

The principal object of the present invention is to provide a thermoelectric assembly which permits greater flexibility in design and results in economical construction.

Another object of the present invention is to provide a thermoelectric assembly which eliminates the need for close tolerances in the machining of the thermoelements.

A further object of the invention is to provide a thermoelectric assembly in which good thermal contact is provided when shrinkage or expansion of the assembly or surface imperfections on the walls of the heat source and heat sink occur.

Other objects and advantages of the present invention will be apparent from the following detailed description, taken in connection with the accompanying drawings, in which.

Although the invention is illustrated and described in conjunction with a thermoelectric generator, it will be understood, of course, that this invention may be employed in a refrigerator utilizing thermoelements as well as in heating devices and other thermoelectric applications.

Figure 1:
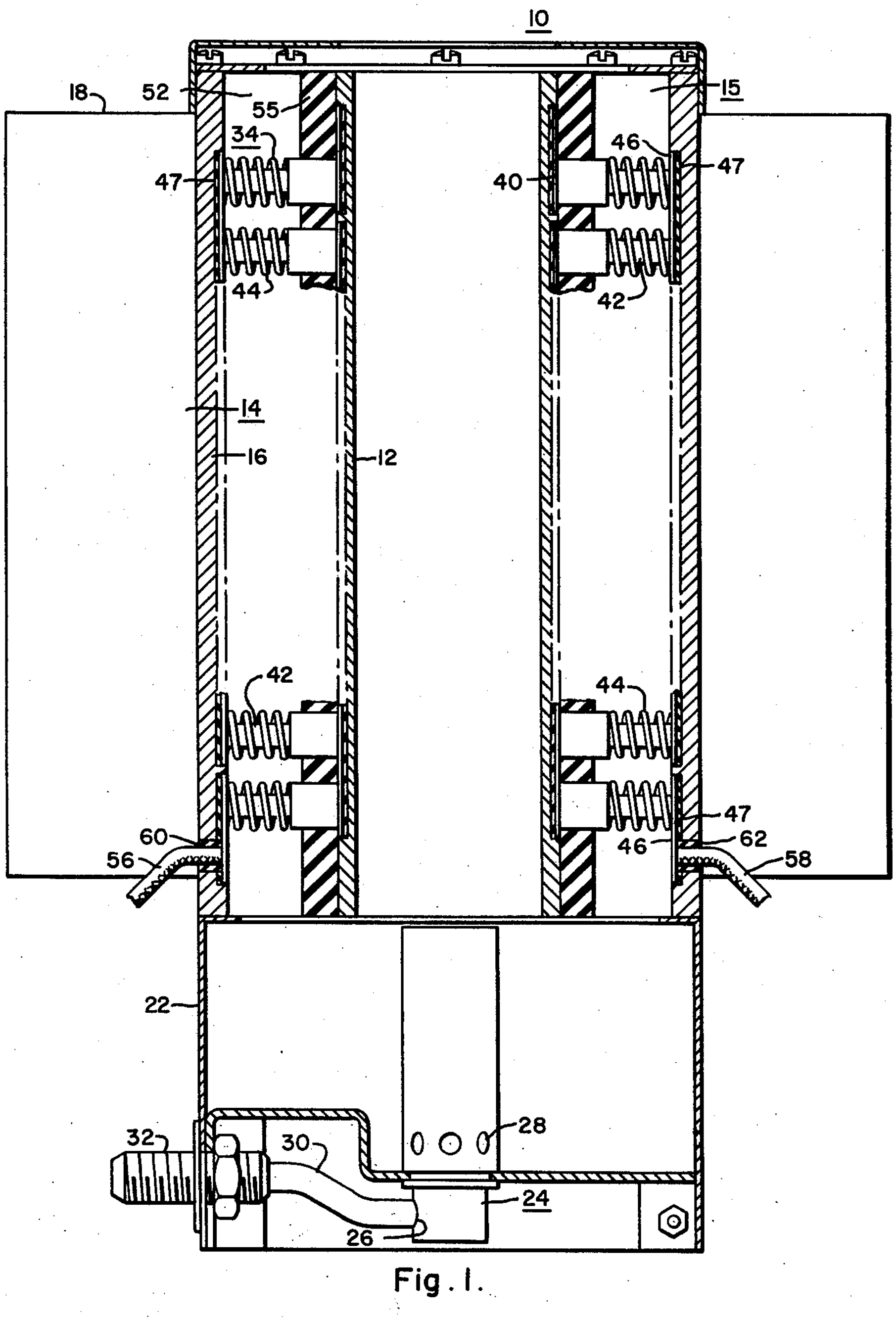
FIGURE 1 is a longitudinal sectional view of a thermoelectric generator incorporating the present invention.
Figure 2:
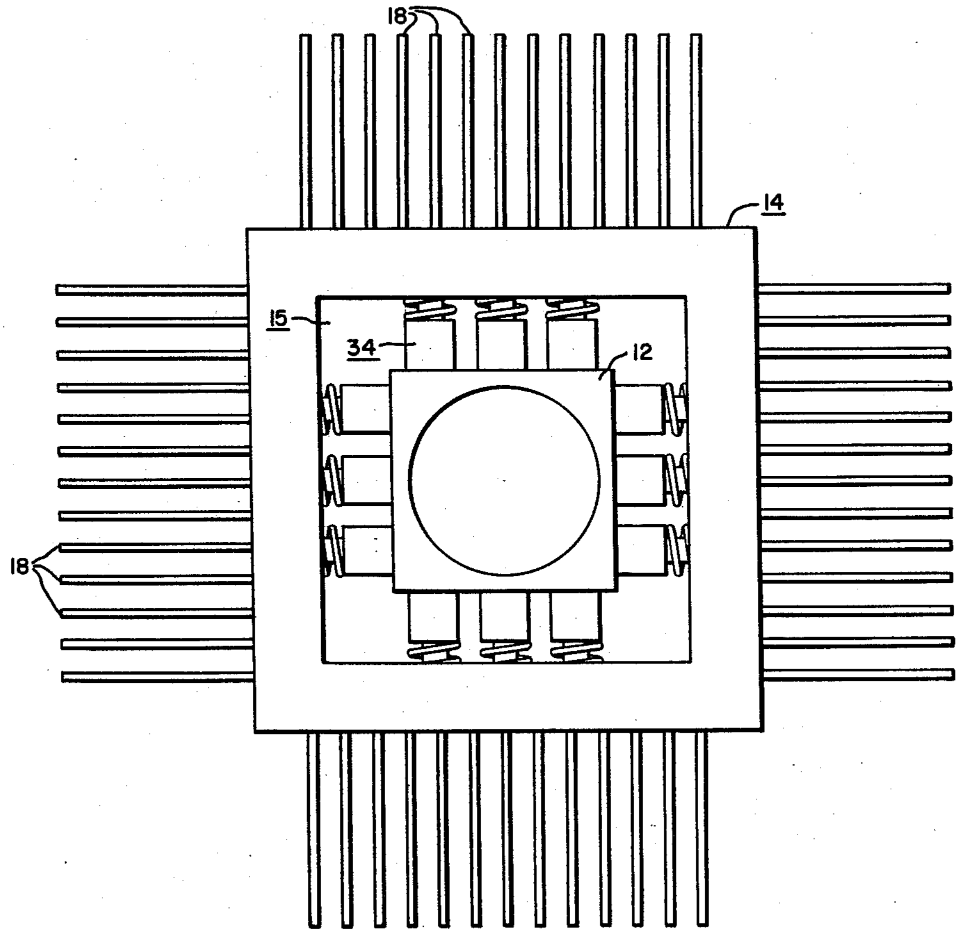
FIG. 2 is an end elevational view of a thermoelectric generator, with the heating unit removed, illustrating the thermoelectric assembly of this invention in assembled position.

In FIG. 1 there is shown a thermoelectric generator 10 which includes a thermal radiator or core 12 constituting a heat source. Thermal radiator 12 is a hollow parallelopiped. It may be designed so that the interior periphery is of circular cross section if desired. Although the interior is illustrated as being circular cross section, it may be of any other suitable or desirable shape. Surrounding the thermal radiator 12 is a thermal radiator 14 constituting a heat sink having planar walls 16 parallel to the exterior planar surfaces of the heat source 12. The walls 16 are secured together, by any suitable means, perpendicular to each other to form an exterior parallelopiped. Extending perpendicularly to the walls 16 are a plurality of cooling fins 18 extending longitudinally over the entire length of the walls 16. The heat source 12 and heat sink 14 constitute a heat exchanger 15. The thermal radiator or core 12 is disposed centrally within the radiator 14 and maintained in that position by means described hereinafter. Secured to the lower end of the thermoelectric device 10 is a burner housing 22. Within the burner housing 22 is disposed a burner 24 having a fuel inlet 26 and air intake openings 28. A fuel line 30 is received within the fuel inlet 26 and extends outwardly of the housing 22. The fuel tube 30 has a threaded fitting 32 for attachment to a fuel source.

Within the space between the thermal radiator or core 12 and the thermal radiator 14, which extends longitudinally of the thermoelectric device 10, are disposed a plurality of thermoelectric assemblies 34. The hot junction of the thermoelectric assembly is disposed in juxtaposition and good thermal contact with the exterior surface of the thermal radiator or heat source 12. The cold junctions of the thermoelectric assembly are disposed adjacent and in close thermal contact with the walls 16 of the thermal radiator 14. When the burner is in operation it heats the thermal radiator 12 by shooting a turbulent flame which impinges on the walls of the core, thus yielding high efficiency heat transfer from the flame to the generator wall. While this method of heating the walls of the thermal radiator 12 is shown and described, it will be understood that any suitable source of heat for the hot junction may be utilized.

Figure 3:
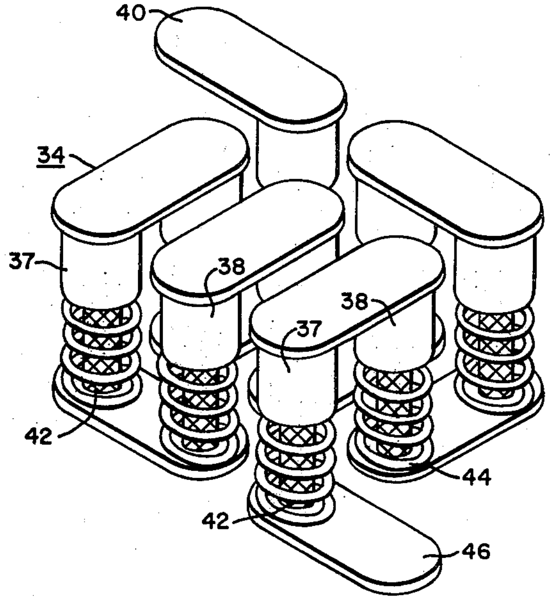
FIG. 3 is a perspective view illustrating the thermoelectric assembly of this invention.
Figure 5:
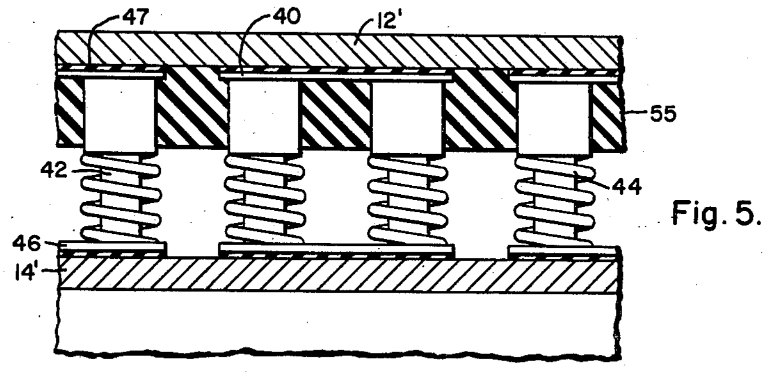
FIG. 5 is an elevational view of a generalized thermoelectric device employing the thermoelectric assembly of this invention.

The thermoelectric assemblies 34 can be seen more clearly in FIGS. 3 and 5. FIG. 3 shows a flexible thermoelectric ladder assembly that makes possible a heat exchanger design that can expand or shrink during heating cycles without causing the thermoelements to fail mechanically. In addition this design permits the construction of thermoelectric generators in which thermoelements can be hermetically sealed. The ladder structure 34 as shown in FIG. 3 consists of P and N thermoelectric semiconductor elements 37 and 38, respectively, connected in series by a suitable metal connecting strap 40. The thermoelements may be cylindrical in cross section, as shown, or any other suitable or desirable shape such as rectangular or polygonal in cross section, presenting flat ends to the connecting strap 40 in order to provide good thermal and electrical connection thereto. The straps 40 may be of any suitable material, as for example copper which has very high thermal conductivity and very low electrical resistance. The straps 40 are preferably flexible in order that they may conform to the surface of the thermal radiator 12 or 14 with which they come in contact. It will of course be understood that the straps 40 may be relatively rigid if desired. It is essential that there be good thermal conductivity between the thermal radiator and the straps 40.

Secured to the end of the thermoelements 37 and 38 remote from the connecting straps 40 is a lead 42 which is preferably a braided copper cable. Other suitable cables may be used, but a copper braided cable is preferred because of its high heat and thermal conductivity. Any cable used must be flexible. If a copper cable is used, generator efficiency is reduced only slightly due to the fact that copper has about 200 times the thermal conductivity and approximately 1000 times the electrical conductivity of the thermoelectric material. A compression spring 44 is slipped around each cable and the cable ends remote from the copper flexible straps 40 are secured to copper straps 46 similar to the copper straps 40. Although coil springs 44 are shown it should be understood that any suitable compression means may be employed, preferably having at least two degrees of freedom in perpendicular directions, as for example bellows or a spring may be inserted within the braided cable. An elastic member or spring may be employed for lead 42. The thermoelectric elements 37 and 38 may be connected in series as shown or a parallel or series-parallel arrangement may be employed. The thermoelectric elements 37 and 38 are of a semiconductor material and are alternately P-type and N-type material, respectively. The straps 40 and 46 connect electrically adjacent thermoelements together. In this manner a flexible ladder assembly of series or series-parallel or parallel connected thermoelements is provided. As many thermoelements as are required to obtain the desired voltage may be connected in the ladder. The thermoelectric ladder assembly 36 is disposed in the space between the thermal radiator 12 and the wall 16 of the thermal radiator with the springs 44 in compression, and the flexible straps 40 and 46 lying in juxtaposition with the wall of the thermal radiator 12 and the wall 16 of the thermal radiator 14, respectively, and in good close thermal relation therewith. It is the equal and opposite forces of springs 44 which maintain the radiator 12 in its centrally disposed position within radiator 14. This results in a construction that need not utilize any thermal or electrical shunts between the heat source and heat sink.

Thus, it can be seen that I have illustrated a thermoelectric generator in which a thermal radiator 12 constituting a heat source and a thermal radiator 14 constituting a heat sink are provided. Intermediate the heat source and heat sink, a flexible ladder thermoelectric assembly is disposed which comprises a plurality of P-type semiconductor thermoelements 37 and N-type thermoelectric elements 38 connected in series with the P and N-type elements in alternate series connection. A burner 24 is provided to supply the heat source 12 with sufficient heat to provide heat flux at the hot junctions of the thermoelectric elements 37 and 38. The thermal radiators 12 and 14 may be of any suitable material. They are preferably shown as being made of metal. However, other good heat conducting materials may be used and certain ceramic electrical insulating materials may be used.

In the embodiment shown wherein a metal heat exchanger 15 is provided, it is essential that the thermoelectric assembly be electrically insulated from the heat exchanger surfaces. For this purpose the surfaces of the thermal radiator 12 and the walls 16 of thermal radiator 14 that come in contact with the straps 40 and 46 of the thermoelectric assembly are electro-chemically coated with a layer 47 of aluminum oxide. However, the insulation may be sprayed alumina, glass or other ceramic material. Any suitable insulation may be used for this purpose which is a good electrical insulator and at the same time has a high thermal conductivity. For example very thin strips of mica may be used for the interior walls of the heat exchanger 10, or they may be coated with a thin layer of silicone rubber, high temperature paint or thin films of mica paper. It should be noted that it is preferable to place the thermoelectric assembly with the copper straps adjacent the spring in contact with the heat sink 14 and the copper straps 40 in contact with the thermoelements adjacent and in contact with the heat source 12. However, they may be disposed in the opposite direction.

Insulation batting or padding 55 as for example glass fibers, may be provided if desired to insulate the hot junctions and to prevent flow of heat through the heat exchanger from heat source 12 to heat sink 14.

At each end of the thermoelectric assembly output leads 56 and 58, respectively, are secured to the straps 46 adjacent the cold junction. In the embodiment illustrated, grommets 60 and 62 which may be of any suitable insulating material are received in openings in the wall 16. Leads 56 and 58 pass through grommets 60 and 62 respectively and are adapted to be connected to the input terminals of a load. If the thermoelectric device is to be utilized as a refrigerator or heating device leads 56 and 58 are, of course, input leads for the thermoelectric assembly.

Figure 4:
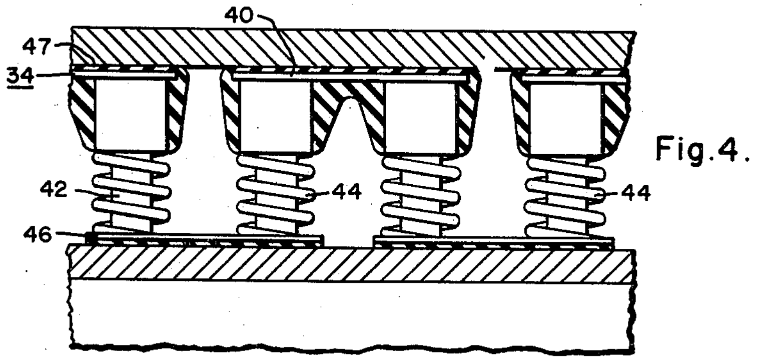
FIG. 4 is a partial elevational view, partly in section, of a modification of the thermoelectric assembly illustrating encapsulated thermoelements.

Looking now to FIG. 4 we find another advantage that ensues from the flexible ladder assembly described hereinabove. Since the thermoelements are not attached to individual hot or cold fins, the resulting generator lends itself to hermetic sealing techniques. FIG. 4 shows a modification of the invention in which the thermoelements are encapsulated in suitable encapsulating material, as for example glasses, thin metal films or ceramics, as shown at 50. This prevents deterioration of the elements 37 and 38 due to the high temperatures to which they are exposed.

The operation of the generator should now be apparent. Looking at FIG. 1, it will be noted that the flames of the burner 24 impinge upon the interior walls of the thermal radiator 12. The heat flux is conducted through the wall and heats the hot junctions of the thermoelectric assembly. In the modification disclosed a cold airflow opening 52 is shown. Cold air is drawn downward across the cold junctions of the thermoelectric assembly and supplies primary and secondary combustion air for the burner. The cooling fins 18 aid in maintaining the cold junctions at a low temperature.

Although a specific heating element and hot air flow system is shown and described herein, it will, of course, be understood that other types of heating element and air flow may be employed so long as it enables the hot junctions to be heated and the cold junctions to be cooled. Since the thermoelements are of a material which produces an E.M.F. when one of their junctions is at a higher temperature than the other, a plurality of additive E.M.F. values are produced in the series circuit of the thermoelectric assemblies. Thus a source of electromotive force results and a lead from each end of the series circuit of the assembly may be connected to supply electrical power.

Although a thermoelectric generator is disclosed, it will be understood that alternatively an electric current can be passed through the series element resulting in a cold junction and a hot junction and the arrangement of elements may be such that this can be used for cooling or heating.

FIGURE 5 discloses a generalized embodiment of the invention. A thermoelectric assembly 34′ identical with the assembly 34 shown in FIGS. 1 and 3 is disposed intermediate a heat source 12′ and a heat sink 14′. Heat source 12′ is shown as a flat plate and heat sink 14′ is shown as a finned plate. Any suitable source of heat may be utilized to supply heat source 12′. Alternatively, a suitable source of voltage may be applied to leads (not shown) at each end of the assembly to provide a cooling area at plate 12′ or a heating area at plate 14′.

It should now be apparent that a thermoelectric device has been provided which is economical to manufacture and which is efficient and reliable. A novel thermoelectric assembly permits greater flexibility in generator design. The need for close tolerances in the machining of the thermoelements is eliminated. The heat exchanger can be designed to permit structural and component expansion without affecting generator efficiency or reliability. The thermoelectric efficiency in addition can be more easily optimized because the length of the two thermoelectric pellets in a generator assembly no longer have to be nearly equal. No bolts or thermal shunts are necessary to connect the hot core with the cold fins since the springs 44 maintain the exchanger in assembled position. This method of construction permits the generator to expand and contract without causing deterioration in generator efficiency or permitting severe tensile or shear stresses to appear across the thermoelements. The generator is rugged and resistant to shock. This thermoelectric device ensures good thermal contact between the hot and cold fins for each thermal element, minimizes thermoelement breakage, and reduces generator cost. It will be apparent that various modifications may be made within the scope of the invention. Variations in design of the heat exchanger and burner may be possible, or other means may be utilized for supplying heat to the heat source 12. This invention may be employed in either a generator, as shown, or a refrigerator or a heating device.

It is to be understood, therefore, that although a specific embodiment of the invention has been shown and described for the purpose of illustration, the invention is not limited to the particular details of construction shown, but in its broadest aspects it includes all equivalent embodiments and modifications which come within the scope of the invention.

I claim as my invention:

1. A thermoelectric assembly comprising a plurality of thermoelectric elements each comprising a body of thermoelectric material and a flexible conductor of a material having high heat and electrical conductivity secured to said body on one end thereof, a plurality of thermally and electrically conductive flexible flat straps for connecting electrically adjacent thermoelements, some of said flat straps connecting electrically adjacent pairs of thermoelectric elements at an end remote from said conductors, other of said straps connecting electrically adjacent pairs of said conductors at their ends remote from said body, compressible biasing means having at least two degrees of freedom intermediate said other straps and said bodies for extending said flexible conductors.

2. A thermoelectric assembly comprising a plurality of thermoelectric elements each comprising a body of thermoelectric material and a flexible conductor secured to said body on one end thereof, a plurality of thermally and electrically conductive flat, flexible straps for connecting electrically adjacent thermoelements, some of said flat straps connecting electrically adjacent pairs of thermoelectric elements at an end remote from said conductors, other of said flat straps connecting electrically adjacent pairs of said conductors at their ends remote from said body, a coil spring receiving each of said conductors and disposed intermediate said other straps and said bodies.

3. A thermoelectric assembly comprising a plurality of thermoelectric elements connected in series, alternate ones of said series connected elements being of P-type and N-type semiconductor material, respectively; each of said elements comprising a body of thermoelectric material and a flexible conductor of a material having high heat and thermal conductivity secured to said body on one end thereof, a plurality of thermally and electrically conductive flat straps for connecting electrically adjacent thermoelements in series, some of said flat straps connecting electrically adjacent pairs of thermoelectric elements at an end remote from said conductors, other of said flat straps connecting electrically adjacent pairs of said conductors at their ends remote from said body, and compressible biasing means having at least two degrees of freedom intermediate said other flat straps and said bodies for extending said flexible conductors.

4. In a thermoelectric device, a thermoelectric assembly including a plurality of thermoelectric elements connected in series, alternate ones of said series connected elements being of P-type and N-type semiconductor material, respectively; each of said elements comprising a body of semiconductor material and a flexible conductor of a material having high thermal and electrical conductivity secured to said body on one end thereof, a plurality of thermally and electrically conductive flat straps for connecting electrically adjacent thermoelectric elements in series, some of said flat straps secured to and connecting electrically adjacent pairs of thermoelectric elements at an end remote from said conductors, other of said flat straps secured to and connecting electrically adjacent pairs of said conductors at their ends remote from said body, compressible biasing means having at least two degrees of freedom in perpendicular directions disposed intermediate said other flat straps and said bodies for extending said flexible conductors, a pair of thermal radiators disposed in parallel planes, one of said radiators being a heat source and the other a heat sink, said assembly disposed intermediate said pair of thermal radiators in compression, a thin layer of electrically insulating thermally conductive material disposed intermediate said radiators and said straps and in intimate thermally conductive relation with said radiators and said straps.

References Cited in the file of this patent

UNITED STATES PATENTS

| | | |
|---|---|---|
| 1,848,655 | Petrik | Mar. 8, 1932 |
| 2,232,961 | Milnes | Feb. 25, 1941 |
| 2,705,746 | Strange | Apr. 5, 1955 |
| 2,872,788 | Lindenblad | Feb. 10, 1959 |
| 2,886,618 | Goldsmid | May 12, 1959 |
| 2,949,497 | Jarvis et al. | Aug. 16, 1960 |
| 2,997,514 | Roeder | Aug. 22, 1961 |

FOREIGN PATENTS

| | | |
|---|---|---|
| 191,712 | Great Britain | July 7, 1923 |